United States Patent [19]

Winkler

[11] 4,046,101
[45] Sept. 6, 1977

[54] VACUUM APPARATUS FOR TREATING ARTICLES, PARTICULARLY A VACUUM EVAPORATOR

[75] Inventor: Otto Winkler, Balzers, Liechtenstein

[73] Assignee: Balzers Patent-und Beteiligungs-Aktiengesellschaft, Liechtenstein

[21] Appl. No.: 724,756

[22] Filed: Sept. 20, 1976

[30] Foreign Application Priority Data

Sept. 23, 1976 Switzerland ............... 012321/76

[51] Int. Cl.² .......................................... C23C 13/08
[52] U.S. Cl. ............................................. 118/49.1
[58] Field of Search ............... 118/49, 49.5, 49.1, 118/48, 50; 219/271, 275

[56] References Cited

U.S. PATENT DOCUMENTS

| | | | |
|---|---|---|---|
| 2,408,614 | 10/1946 | Dimmick | 118/49 |
| 2,557,379 | 6/1951 | Hancock et al. | 118/48 UX |
| 2,812,411 | 11/1957 | Moles | 118/48 X |
| 2,884,894 | 5/1959 | Ruppert et al. | 118/48 |
| 2,986,115 | 5/1961 | Toulmin | 118/48 |
| 3,757,083 | 9/1973 | Dietz et al. | 219/464 |
| 3,957,547 | 5/1976 | Schmider | 118/49.1 |

Primary Examiner—Ronald Feldbaum
Attorney, Agent, or Firm—McGlew and Tuttle

[57] ABSTRACT

A vacuum apparatus for treating articles, particularly a vacuum evaporator, for applying coatings of material onto articles, such as lenses, comprises a housing which defines an interior treatment chamber. The chamber includes a support means for supporting a substance to be evaporated which includes means for electrically heating the substance located at a bottom wall and which includes an opposite top wall which carries a support for the article to be coated or treated. A foil material capable of being electrically heated is supported in the housing in spaced location from the side and the top walls at least and it is held in position by clamping elements which provide means for connecting the foil to an electrical supply source for supplying a heating current.

3 Claims, 1 Drawing Figure

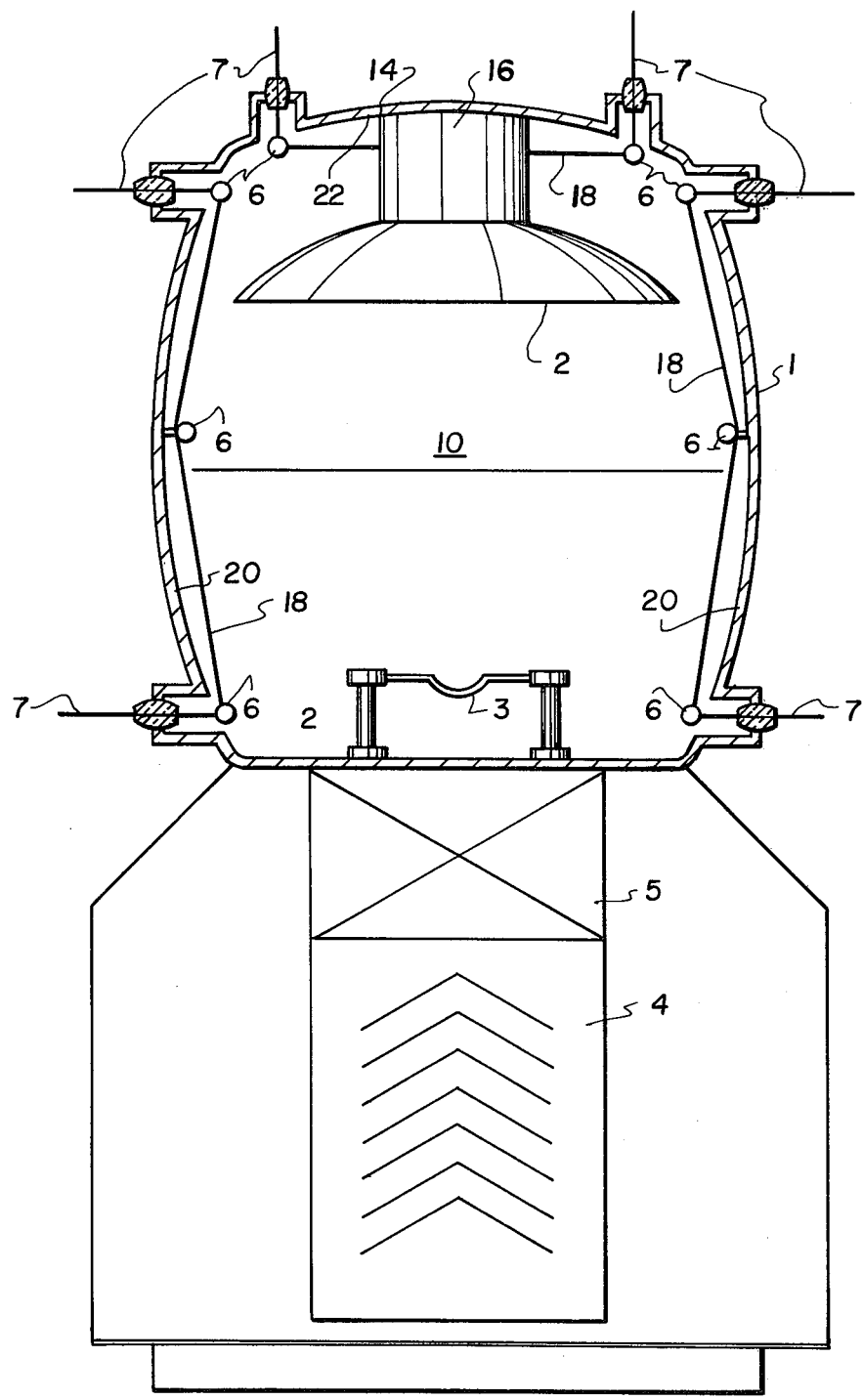

VACUUM APPARATUS FOR TREATING ARTICLES, PARTICULARLY A VACUUM EVAPORATOR

FIELD AND BACKGROUND OF THE INVENTION

This invention relates in general to the construction of vacuum treating chambers and, in particular, to a new and useful vacuum treating chamber particularly for coating articles with an evaporated substance which includes a pump connected to the chamber for evacuating the chamber and which also includes a support for a substance to be evaporated opposite a support for the article to be coated and a lining of an interior foil material which is connected electrically so that it can be heated.

DESCRIPTION OF THE PRIOR ART

It is well known in vacuum apparatus that the pumping time is a function of the loading of the interior walls and the built-in equipment with water and that, in turn, this loading is a function, not only of the moisture content of the ambient air coming into contact with the surfaces and of the temperature of the surfaces but, in particular, of the degree of fouling, i.e., the actual extenson of the surface area of the inside walls of the apparatus.

To facilitate $H_2O$ desorption, it has been proposed to heat the walls of the recipient prior to introducing air and to keep them at an increased temperature during the pumping down as well. A baking out at relatively high temperatures is necessary, particularly in ultra-high vacuum devices, in order to be able to attain the required low final pressures. On the other hand, in most cases, while carrying out a vacuum operation, the temperature of the walls must be low to impede gas escape from the walls during the operation.

In a reactive vapor deposition of thin layers in an oxygen atmosphere, it is particularly important to keep the partial pressure of water vapor and hydrocarbons as low as possible, in order to avoid an absorption by the layers. Otherwise, in order to obtain a satisfactory oxidation, the partial pressure of the oxygen must be increased to such values that the results are adversely affected by a dispersion of the molecules of the evaporated material in the gas atmosphere and by gas inclusion in the layers.

In evaporators, limits are set to the temperature interval between baking out and cooling. First, because thereby, the temperature of the substrate is also influenced, and second, because with greater temperature intervals, the cycle periods become so long that the throughput speed and, thereby, the economy, are reduced. Also, taking into account the great thermal capacity of the chamber walls, too much power would be needed. Therefore, one manages so that the apparatus is cleaned from time to time, as soon as the pumping time becomes too long for the required final pressure or the quality of the layers begins to worsen.

It has also been proposed to provide a vacuum chamber with heatable inside walls which permit the degassing of the chamber by evacuation. If such a degassing takes place in a separate operation, which is time consuming, the chamber must be opened again for the following charging with the articles to be treated, which involves a risk of a new adsorption of $H_2O$ from the humid ambient air. If, on the other hand, for degassing, the walls are heated immediately before the intended treatment, while the articles are already placed in the recipient, a simultaneous heating of the articles is inevitable. This, however, is inadmissible in many instances, for example, for sensitive optical glass on which thin layers have to be deposited. It would be necessary to at least limit the heating to low temperatures, for example, of 100° C which, however, is hardly efficient for the degassing.

There are cases, of course, in which such a heating of the articles is admissible or even intended, as, for example, in a vacuum furnace. Known are vacuum furnaces in which heating elements are mounted between the inside wall of the furnace housing and the articles and surround the articles on all sides. Double-walled ultra-high vacuum apparatus are also known in which the inner wall of the chamber comprises a thin jacket of a high-melting metal, which jacket can be heated for degassing. Such double-walled apparatus, however, are expensive, in particular, because of the high temperature materials to be used for the inner heatable jacket. In addition, as soon as the jacket is heated, the articles to be treated are heated simultaneously which, as mentioned, is frequently inadmissible.

SUMMARY OF THE INVENTION

The present invention is directed to a vacuum apparatus for treating articles, of a design such that during operation, the walls can be largely kept free from adsorbed water vapor, even after extended use, without the necessity of simultaneously heating the articles to be treated or of placing them in the treating chamber only after the walls have been cooled down again. The invention is further directed to an apparatus making it possible, without the necessity of being cleaned each time, to carry out the desired operation while starting from technical vacuum conditions which otherwise, in the prior art, are given only in a device immediately after cleaning. The inventive apparatus should also ensure a higher economy in operation, due to a reduced pumping time.

In accordance with the invention, a vacuum apparatus for treating articles, particularly a vacuum evaporator, including a treating chamber with a pump connection and equipped for receiving the articles and performing the desired treatment, and having heatable intermediate walls positioned between the inside wall of the treating chamber and the articles to be treated, comprises clamping devices for exchangeable thin metal foils, which are mounted in the chamber and provided with electric current supply leads.

In vacuum evaporators, it is advisable to cover all locations with are visible from the evaporation sources with heatable foils. These foils are heated to cause the desorption of water vapor prior to the deposition by evaporation. It is even possible, without damaging the articles to be coated, to heat the foils temporarily up to a temperature at which all adsorbed gases, not only $H_2O$, are removed almost quantitatively. By using thin foils having a low thermal inertia, which are brought to the desired temperature after the pre-evacuation of the apparatus and which can be heated very rapidly and cooled rapidly again to a lower temperature of equilibrium, it is obtained that the thermal load of the articles remains negligibly small and that the degassing is complete and largely independent of the thickness of the layers which have been deposited on the foils already during preceding operations. Consequently, upon every such temporary heating operation, conditions of a freshly cleaned apparatus are created, with a correspondingly short pumping time. The temperature of the heating foils is also easily programmable so that the degassing may be kept under controlled conditions.

Preferably, foils having a thickness of 0.1 mm or even less are used. Temperatures of about 400° C are sufficient for the degassing, so that cheap aluminum foils or, for higher temperatures, steel foils can be used. After repeated use, the foils which, in the preceding operations have already been coated with a thicker layer, are replaced by new ones. This results in a practice which is very economical as compared to the hitherto usual frequent cleaning of the apparatus.

In some instances, a higher temperature of the substrates is desirable during the vapor deposition, for example, to obtain a better adhesion of the deposited layers. In such cases, the inventive apparatus may be advantageously employed for keeping the walls of the evaporation chamber on all sides at the same temperature during the deposition also, by a suitably adjusted heat input. This eliminates temperature gradients in the substrates to be coated and, consequently, a possible risk of warping or cracking of these substrates (lenses), due to a nonuniform heating, is substantially reduced. In addition, in this application, the layers deposited on the foils at a higher temperature adhere stronger so that they tend less to peeling off during the cooling and reheating, wherefore, thicker grown layers may be tolerated before the renewal of the foils.

The clamping devices for the foils may be designed in any suitable manner ensuring a satisfactory passage of the current and a rapid exchange. For example, holding devices for foil rolls may be provided and designed so that the foils can be spread over parts of the inside walls of the chamber in the manner of roller blinds and the free ends of the foils can be clamped between current transferring terminal strips. Care must be taken to ensure a satisfactory current flow between the holding devices and the foils, in order to prevent local overheating. Advantageously, aside from the walls of the recipient, larger built-in equipment is also covered by means of such heatable foil walls and thus protected against fouling, particularly against deposition of the evaporated substances. It may be useful, for example, to shield the devices for driving a cap-shape support for the articles to be coated, as well as the suction openings, and measuring instruments which are provided.

Accordingly, it is an object of the invention to provide a vacuum apparatus for treating articles and, particularly, a vacuum evaporator, which comprises a housing, which defines an interior treatment chamber with means for evacuating the chamber, and with means for holding an article to be treated in spaced relationship to a material which will be evaporated, and which includes a thin foil located in the chamber in spaced relationship to at least one of the walls, and support means for supporting the thin foil within the chamber and for supplying an electrical heating current thereto.

A further object of the invention is to provide a device for treating materials of articles in a vacuum which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference should be had to the accompanying drawing and descriptive matter in which there is illustrated a preferred embodiment of the invention.

BRIEF DESCRIPTION OF THE DRAWING

The only FIGURE of the drawing is a transverse sectional view of a device for effecting the vacuum deposition of a substance on an article, such as a lens, constructed in accordance with the invention.

DESCRIPTION OF THE PREFERRED EMBODIMENT

Referring to the drawing in particular, the invention embodied therein, comprises an apparatus for the vapor deposition of a coating on a lens and which includes a housing, generally designated 1, defining an interior evaporation chamber 10 which is connected through a suitable valve arrangement 5 to an evacuation device, such as a pump 4. Chamber 10 includes a bottom wall 12 which has a stand or support 3 for the material to be evaporated and this advantageously comprises an electrically heatable cradle which accommodates an evaporable substance to form a vapor within the chamber 10. The substance is supported on the cradle or support 3 in opposition to an article which is secured to a cup-shape article support 2 which is connected to a roof or top wall portion 14 which is rotatably mounted thereon. Support 2 is rotated by a drive carried in a base portion 16. The articles to be coated, such as lenses, are supported on the device 2 and are rotated during the coating operation. The pumping unit 4 and the valve connection 5 are such that the pump 4 may be disconnected after the evacuation of the chamber 10 and a pure reaction gas introduced into the chamber.

In accordance with the invention, an electrically heatable material or foil 18 is arranged so that it may be positioned in spaced relationship to at least one of the walls, such as the side walls 20, or the top wall 22. For this purpose, the foil 18 is supported by clamping devices 6 which are connected to a current supply lead 7 to supply electrical current for heating the foil 18. Any suitable current leadins are sufficient for connection to the clamping element 6 and the foil 18 and will be constructed in accordance with the required amperage. Sealed-in wires are sufficient or high-amperage bushings may be used.

The invention refers to vacuum apparatus which requires vacuum-tightness in order to keep a clean atmosphere therein for carrying out any desired process and it is not limited to the particular vapor deposition process which is described herein.

While a specific embodiment of the invention has been shown and described in detail to illustrate the application of the principles of the invention, it will be understood that the invention may be embodied otherwise without departing from such principles.

What is claimed is:

1. A vacuum apparatus for vapor deposition on articles, comprising a housing defining an interior treatment chamber with top, bottom and side walls, article support means in said chamber for supporting an article to be treated, evaporation material support means for supporting a substance to be evaporated spaced from said article support means, pump means connected to said housing for evacuating said housing chamber, a heatable vapor-deposit burner-foil material located in said chamber in spaced relationship to and shielding at least one of said walls, and support means for supporting said foil material within said chamber and for supplying electrical heating current thereto.

2. A vacuum apparatus, according to claim 1, wherein said support means comprise clamping devices, said foil comprising exchangeable thin metal foils, said support means including electrical current supply leads connected to said foil.

3. A vacuum apparatus, according to claim 1, wherein said foil material is supported on each of the sides and top wall of said chamber, said support means comprising clamping elements holding said foil material in spaced relationship to the interior wall and providing an insulated electrical connection to the exterior of said chamber.

* * * * *

UNITED STATES PATENT OFFICE
CERTIFICATE OF CORRECTION

Patent No. 4,046,101  Dated  Sept. 6, 1977

Inventor(s) Otto Winkler

It is certified that error appears in the above-identified patent and that said Letters Patent are hereby corrected as shown below:

On the cover sheet, Item [30], "012321/76" should read:

---- 012321/75 ----.

Signed and Sealed this

Twenty-fourth Day of October 1978

[SEAL]

Attest:

RUTH C. MASON
Attesting Officer

DONALD W. BANNER
Commissioner of Patents and Trademarks